(12) United States Patent
Chen et al.

(10) Patent No.: US 11,506,719 B2
(45) Date of Patent: Nov. 22, 2022

(54) VEHICLE BATTERY MONITORING METHOD AND ASSEMBLY

(71) Applicant: Ford Global Technologies, LLC, Dearborn, MI (US)

(72) Inventors: Hanyang B. Chen, Canton, MI (US); Michael J. Irby, Monroe, MI (US); Matthew Thomas Loiselle, LaSalle, MI (US); William David Treharne, Ypsilanti, MI (US); Mark E. Shields, Plymouth, MI (US); Josephine S. Lee, Novi, MI (US)

(73) Assignee: Ford Global Technologies, LLC, Dearborn, MI (US)

(*) Notice: Subject to any disclaimer, the term of this patent is extended or adjusted under 35 U.S.C. 154(b) by 285 days.

(21) Appl. No.: 16/550,657

(22) Filed: Aug. 26, 2019

(65) Prior Publication Data
US 2021/0063492 A1 Mar. 4, 2021

(51) Int. Cl.
| B60R 16/023 | (2006.01) |
| G01R 31/3828 | (2019.01) |
| F02N 11/08 | (2006.01) |
| F02N 11/14 | (2006.01) |

(52) U.S. Cl.
CPC ...... *G01R 31/3828* (2019.01); *B60R 16/0234* (2013.01); *F02N 11/0825* (2013.01); *F02N 11/14* (2013.01)

(58) Field of Classification Search
CPC ...... B60W 10/06; B60W 10/26; B60W 20/13; F02N 11/006; F02N 11/04; F02N 11/0835; F02N 11/0866; F02N 11/0862; G01R 31/3828
See application file for complete search history.

(56) References Cited

U.S. PATENT DOCUMENTS

| 6,941,917 | B2* | 9/2005 | Kawai ............... | F02N 11/0866 123/179.4 |
| 7,679,328 | B2* | 3/2010 | Mizuno ............. | G01R 31/3828 320/132 |
| 8,384,237 | B2* | 2/2013 | Nefcy ................ | F02N 11/0866 307/9.1 |
| 9,085,291 | B2* | 7/2015 | Fushiki ............... | B60W 20/40 |
| 9,422,906 | B2* | 8/2016 | Kees .................... | B60K 6/485 |
| 9,463,790 | B2* | 10/2016 | Thompson ........... | B60W 20/40 |
| 9,768,639 | B2* | 9/2017 | Nakazawa ........... | B60L 58/15 |

(Continued)

FOREIGN PATENT DOCUMENTS

| JP | 3175617 B2 | 8/1998 |
| JP | 5910462 B2 | 4/2016 |

(Continued)

*Primary Examiner* — Jeffrey J Restifo
(74) *Attorney, Agent, or Firm* — David Kelley; Carlson, Gaskey & Olds, P.C.

(57) ABSTRACT

A monitoring method includes, among other things, within a vehicle, providing a first electrical system with an auxiliary battery, and a second electrical system with a primary battery. The method further includes electrically coupling the first electrical system to the second electrical system, electrically loading the auxiliary battery and the primary battery, and comparing an electrical parameter of the auxiliary battery to a threshold value to assess a state of the auxiliary battery.

15 Claims, 3 Drawing Sheets

(56) References Cited

U.S. PATENT DOCUMENTS

| | | | |
|---|---|---|---|
| 9,862,275 B2* | 1/2018 | Cha | B60L 58/15 |
| 9,969,292 B2* | 5/2018 | Thieme | B60L 58/20 |
| 10,005,453 B2* | 6/2018 | Kraska | B60W 10/08 |
| 10,112,487 B1* | 10/2018 | Lee | G01R 31/3835 |
| 10,160,409 B2* | 12/2018 | Rtail | F02N 11/084 |
| 10,253,743 B2* | 4/2019 | Choi | B60W 10/06 |
| 10,355,628 B2* | 7/2019 | Arai | H02P 9/009 |
| 10,385,818 B2* | 8/2019 | Kobayashi | F02N 11/08 |
| 10,407,050 B2* | 9/2019 | Atala | B60K 6/48 |
| 10,449,953 B2* | 10/2019 | Choi | B60L 15/20 |
| 10,538,233 B2* | 1/2020 | Kim | B60W 30/194 |
| 10,549,731 B2* | 2/2020 | Lauffer | B60T 7/12 |
| 10,550,818 B2* | 2/2020 | Choi | F02N 11/0866 |
| 10,562,517 B2* | 2/2020 | Shin | B60W 10/02 |
| 10,597,024 B2* | 3/2020 | Khafagy | B60K 6/28 |
| 10,611,257 B2* | 4/2020 | Moriya | B60L 58/16 |
| 10,625,730 B2* | 4/2020 | McCullough | B60W 20/10 |
| 10,677,176 B2* | 6/2020 | Shibata | F02N 11/08 |
| 10,703,210 B2* | 7/2020 | Kees | B60L 15/2045 |
| 10,730,504 B2* | 8/2020 | Shin | B60W 20/13 |
| 10,800,396 B2* | 10/2020 | Ford | B60W 10/02 |
| 10,876,510 B2* | 12/2020 | Ciaccio | B60L 58/18 |
| 10,889,289 B2* | 1/2021 | Hoshino | B60W 10/08 |
| 10,910,972 B2* | 2/2021 | Saito | B60L 1/00 |
| 10,946,751 B2* | 3/2021 | Uchimura | B60L 58/12 |
| 11,002,239 B2* | 5/2021 | Watanabe | B60W 20/40 |
| 2004/0026140 A1* | 2/2004 | Suzuki | B60L 58/18 |
| | | | 180/65.26 |
| 2015/0167614 A1* | 6/2015 | Malone | B60W 10/11 |
| | | | 701/54 |
| 2015/0370264 A1* | 12/2015 | Colvin | G05D 16/2066 |
| | | | 701/51 |
| 2016/0207541 A1* | 7/2016 | Mansur | B60W 10/26 |
| 2016/0303992 A1* | 10/2016 | Lovett | B60L 58/20 |

FOREIGN PATENT DOCUMENTS

| | | | | |
|---|---|---|---|---|
| JP | 2017112654 A | | 6/2017 | |
| JP | 2019057759 A | * | 4/2019 | H03F 1/0205 |

* cited by examiner

VEHICLE BATTERY MONITORING METHOD AND ASSEMBLY

TECHNICAL FIELD

This disclosure relates to monitoring a battery of a vehicle.

BACKGROUND

Generally, a drive-cycle for a vehicle begins at key-on or when the vehicle otherwise started. The drive cycle then ends at key-off. Stop-start vehicles can incorporate a stop-start system that selectively shuts down an engine during portions of the drive cycle. Shutting down the engine can conserve fuel and reduce emissions.

Some electrified vehicles include a stop-start system. Electrified vehicles, such as hybrid electric vehicles, may use electric machines powered by a traction battery to generate torque that rotates vehicle drive wheels when the engine is shut down.

SUMMARY

A monitoring method according to an exemplary aspect of the present disclosure includes, among other things, within a vehicle, providing a first electrical system with an auxiliary battery, and a second electrical system with a primary battery. The method further includes electrically coupling the first electrical system to the second electrical system, electrically loading the auxiliary battery and the primary battery, and comparing an electrical parameter of the auxiliary battery to a threshold value to assess a condition of the auxiliary battery.

In a further example of the forgoing method, the electrical parameter is a discharge current from the auxiliary battery.

A further example of any of the forgoing methods includes detecting the discharge current from the auxiliary battery using a Hall effect sensor.

In a further example of any of the forgoing methods, the vehicle is a stop-start vehicle, and electrically loading the auxiliary battery and the primary battery includes cranking an engine of the vehicle at a start of a vehicle drive cycle. The method includes, later in the vehicle drive cycle, stopping the engine and then warm cranking the engine using a starter generator powered by the primary battery.

In a further example of any of the forgoing methods, the starter generator is a belt integrated starter generator.

A further example of any of the forgoing methods includes electrically decoupling the first electrical system from the second electrical system when warm cranking the engine using the starter generator.

A further example of any of the forgoing methods includes powering electrical loads of the vehicle using the auxiliary battery when the first electrical system is decoupled from the second electrical system.

A further example of any of the forgoing methods includes transitioning at least one switch to electrically couple the first electrical system to the second electrical system, and transitioning the at least one switch to electrically decouple the first electrical system from the second electrical system.

In a further example of any of the forgoing methods, the at least one switch is within a battery isolation box.

A further example of any of the forgoing methods includes cold cranking the engine at the start of the vehicle drive cycle using a starter motor powered by the auxiliary battery.

A further example of any of the forgoing methods includes disabling a start-stop function of the vehicle in response to the condition of the auxiliary battery.

A further example of any of the forgoing methods includes communicating a message to a user of the vehicle in response to the condition of the auxiliary battery.

A further example of any of the forgoing methods includes disabling a DC/DC converter within the first electrical system during the comparing.

A monitoring assembly according to another exemplary aspect of the present disclosure includes at least one sensor operable to detect an electrical parameter relating to an auxiliary battery that is within a first electrical system of a vehicle, a primary battery within an second electrical system of a vehicle, at least one switch configured to transition between a state that electrically couples the first electrical system to the second electrical system and a state that electrically decouples the first electrical system from the second electrical system, and a controller. The controller, when the auxiliary battery and the primary battery are electrically loaded, commands the at least one switch to electrically couple the first electrical system to the second electrical system, and compares an electrical parameter of the auxiliary battery to a threshold value to assess a condition of the auxiliary battery.

In a further example of the foregoing assembly, the electrical parameter is a discharge current from the auxiliary battery.

In a further example of any of the foregoing assemblies, the auxiliary battery and the primary battery are electrically loaded by cranking an engine at a start of a vehicle drive cycle. The method further includes a starter motor of the second electrical system. The starter motor is powered by the primary battery to cold crank the engine at the start of the vehicle drive cycle.

In a further example of any of the foregoing assemblies, the auxiliary battery and the primary battery are electrically loaded by cranking an engine at a start of a vehicle drive cycle. The vehicle is a stop-start vehicle. The assembly includes a starter generator that is powered by the primary battery to warm crank the engine later in the vehicle drive cycle.

In a further example of any of the foregoing assemblies, the controller commands the at least one switch to electrically decouple the first electrical system from the second electrical system when the starter generator is used to warm crank the engine later in the drive cycle.

A further example of any of the foregoing assemblies includes a battery isolation box that includes the at least one switch.

In a further example of any of the foregoing assemblies, the controller commands a stop-start function to be disabled in response to the electrical parameter being below the threshold value.

The embodiments, examples and alternatives of the preceding paragraphs, the claims, or the following description and drawings, including any of their various aspects or respective individual features, may be taken independently or in any combination. Features described in connection with one embodiment are applicable to all embodiments, unless such features are incompatible.

BRIEF DESCRIPTION OF THE FIGURES

The various features and advantages of the disclosed examples will become apparent to those skilled in the art from the detailed description. The figures that accompany the detailed description can be briefly described as follows.

DETAILED DESCRIPTION

This disclosure details exemplary methods and assemblies utilized to monitor a battery of a vehicle. The embodiments described herein are particularly useful to monitor an auxiliary low-voltage battery of a stop-start electrified vehicle.

Figure 1:
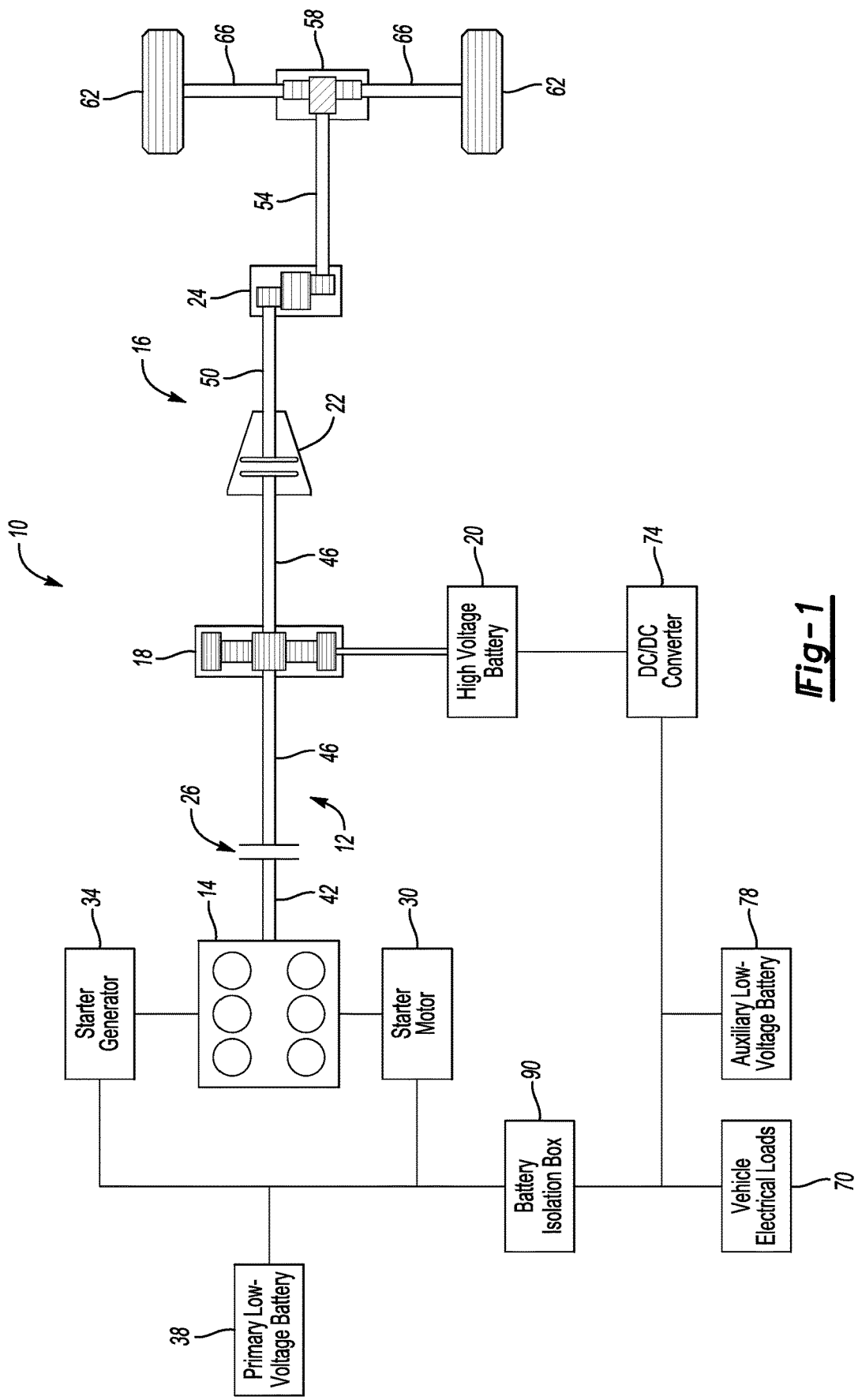
FIG. 1 schematically illustrates portions of a powertrain along with other areas of an electrified vehicle.

FIG. 1 schematically illustrates selected portions of an electrified vehicle 10. Although the exemplary embodiment is illustrated as a hybrid electric vehicle (HEV), the present disclosure may be applicable to other types of vehicles. In addition, although a specific component relationship is illustrated in FIG. 1, this illustration is not intended to limit this disclosure. In other words, it should be readily understood that the placement and orientation of the various components of the electrified vehicle 10 could vary within the scope of this disclosure.

The exemplary electrified vehicle 10 includes a powertrain 12. The powertrain 12 includes an engine 14 and a transmission system 16 that is selectively driven by the engine 14. In one embodiment, the transmission system 16 is a modular hybrid transmission (MHT). In an MHT, the engine can be auto stopped as the vehicle slows during a drive cycle. The engine can then be warm cranked and automatically restarted in response to relief on a brake pedal or pressing of an accelerator pedal. The stopping of the engine during the drive cycle can increase vehicle fuel-economy and reduce emissions.

The transmission system 16 can include an electric machine 18 powered by a high-voltage battery 20, a torque converter 22, and a multiple-step ratio automatic transmission, or gearbox 24. In one embodiment, the electric machine 18 is configured as an electric motor. However, the electric machine 18 could alternatively be configured as a generator or a combined motor/generator within the scope of this disclosure. The electric machine 18 may be any one of a plurality of types of electric machines. By way of one non-limiting embodiment, the electric machine 18 could be a permanent magnet synchronous motor.

The engine 14 and the electric machine 18 may both be employed as available drive sources for the electrified vehicle 10. The engine 14 generally represents a power source that may include an internal combustion engine such as a gasoline, diesel, or natural gas powered engine, or a fuel cell. The engine 14 generates power and corresponding torque that is supplied to the electric machine 18 when an engine disconnect clutch 26 that is disposed between the engine 14 and the electric machine 18 is engaged.

The electrified vehicle 10 is equipped with both a starter motor 30 and a starter generator 34. The starter motor 30 or the starter generator 34 can be used to provide torque to crank (or start) the engine 14.

In the exemplary embodiment, the starter motor 30 is used for cold cranks of the engine 14. A cold crank is at the start of a vehicle drive cycle. The cold crank can occur when the vehicle is in a parking gear.

The starter generator 34 is, in the exemplary embodiment, belt integrated starter generator (BISG). The starter generator 34 is used for warm cranks of the engine 14. A warm crank occurs when the vehicle 10 is operating during a drive cycle and after the initial cold crank. The warm crank occurs when the vehicle 10 is in a driving gear.

A primary low-voltage battery 38 can power the starter motor 30 during a cold crank of the engine 14. The primary low-voltage battery 38 can power the starter generator 34 during a warm crank of the engine 14.

When the engine disconnect clutch 26 is at least partially engaged, power flow from the engine 14 to the electric machine 18 or from the electric machine 18 to the engine 14 is possible. For example, the engine disconnect clutch 26 may be engaged and the electric machine 18 may operate as a generator to convert rotational energy provided by a crankshaft 42 and an electric machine shaft 46 into electrical energy to be stored in the high-voltage battery 20. The engine disconnect clutch 26 can also be disengaged to isolate the engine 14 from the remainder of the powertrain 12 such that the electric machine 18 can act as a sole power source for propelling the electrified vehicle 10. The electric machine shaft 46 may extend through the electric machine 18. The electric machine 18 is continuously drivably connected to the electric machine shaft 46, whereas the engine 14 is drivably connected to the electric machine shaft 46 only when the engine disconnect clutch 26 is at least partially engaged.

The electric machine 18 is connected to the torque converter 22 via the electric machine shaft 46. The torque converter 22 is therefore connected to the engine 14 when the engine disconnect clutch 26 is at least partially engaged. The torque converter 22 includes an impellor fixed to the electric machine shaft 46 and a turbine fixed to a transmission input shaft 50. The torque converter 22 thus provides a hydraulic coupling between the electric machine shaft 46 and the transmission input shaft 50.

The transmission gearbox 24 may include gear sets (not shown) that are selectively operated using different gear ratios by selective engagement of friction elements such as clutches, planetary gears, and brakes (not shown) to establish the desired multiple discrete or step drive ratios. The transmission gearbox 24 may be automatically shifted from one ratio to another based on various vehicle and ambient operating conditions. The transmission gearbox 24 then provides powertrain output torque to a transmission output shaft 54.

The transmission output shaft 54 may be connected to a differential 58. The differential 58 drives a pair of drive wheels 62 via respective axles 66.

Referring again to the primary low-voltage battery 38, in addition to powering the starter motor 30 and the starter generator 34, the primary low-voltage battery 38 can, as required, provide power to various vehicle electrical loads 70. Vehicle electrical loads 70 can include electrical loads unrelated to electrical loads of the powertrain 12. Exemplary vehicle electrical loads 70 can include powering headlights, instrument clusters, blower fans, engine control units, electrical power during units, etc.

When the primary low-voltage battery 38 is powering the starter motor 30 or the starter generator 34, the primary low-voltage battery 38 may be unable to adequately power the vehicle electrical loads 70. At such times, the vehicle electrical loads 70 can be powered by the high-voltage battery 20 through a DC/DC converter 74.

An auxiliary low-voltage battery 78 can further be used to provide, or supplement the supply of power, to the vehicle electrical loads 70 when the primary-low voltage battery is powering the starter motor 30 or the starter generator 34. The auxiliary low-voltage battery 78 may be relied on, for example, if the DC/DC converter 74 is unable to provide adequate power to the vehicle electrical loads 70.

The primary low-voltage battery 38 and the auxiliary low-voltage battery 78 are both 12-Volt, lead-acid batteries in the exemplary embodiment. The primary low-voltage battery 38 can be sized to have a capacity of up to 80 amp-hours. The auxiliary low-voltage battery 78 can have a lower capacity, such as 8 amp-hours, since the auxiliary low-voltage battery 78 is relied on less frequently than the primary low-voltage battery 38.

The exemplary vehicle 10 incorporates a monitoring assembly that can execute a monitoring method for periodically assessing a condition of the auxiliary low-voltage battery 78. Among other things, assessing the condition of the auxiliary low-voltage battery 78 can help a user understand when replacing the auxiliary low-voltage battery 78 is required. The condition of the auxiliary low-voltage battery 78 can deteriorate due to, for example, sulfation, lost active material, lost water, or shorted cells. The assembly and methods described in this disclosure can detect deteriorated conditions of the auxiliary low-voltage battery 78.

Figure 2:
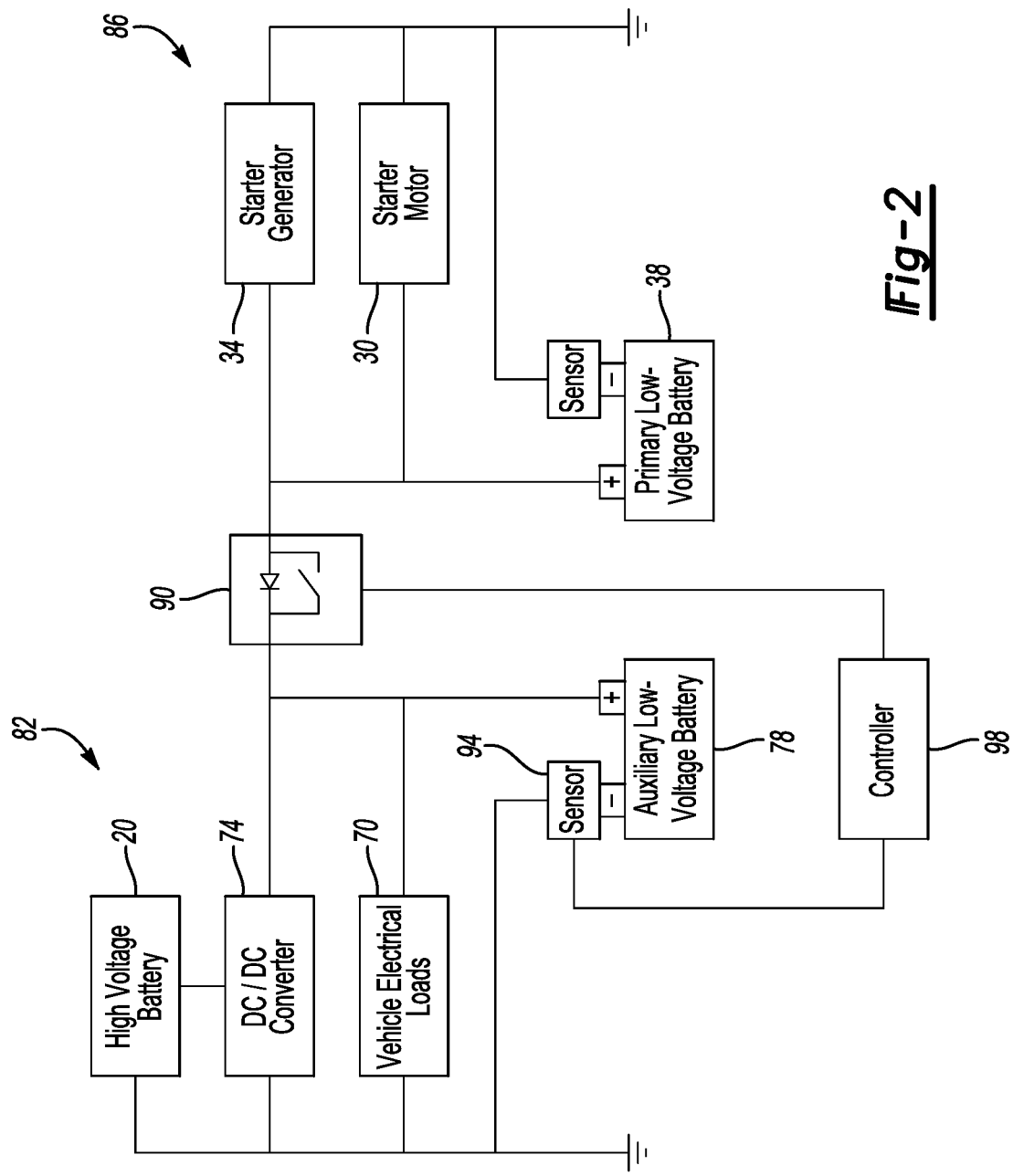
FIG. 2 schematically illustrates electrical systems from the electrified vehicle of FIG. 1.

With reference now to FIG. 2, a first electrical system 82 of the vehicle 10 includes the high-voltage battery 20, the DC/DC converter 74, the vehicle electrical load 70, and the auxiliary low-voltage battery 78. A second electrical system 86 of the vehicle 10 includes the starter generator 34, the starter motor 30, and the primary low-voltage battery 38.

The vehicle 10 further includes a battery isolation box (BIB) 90, which can be used to selectively electrically couple or electrically decouple the first electrical system 82 and the second electrical system 86. The BIB 90 can include at least one switch that is transitioned to provide the desired coupling or decoupling of the first electrical system 82 and the second electrical system 86. Decoupling the first electrical system 82 from the second electrical system 86 can prevent an inrush of current between the first electrical system 82 and the second electrical system 86 when cranking the engine 14.

In the past, the BIB 90 electrically decoupled the first electrical system 82 from the second electrical system 86 when the primary low-voltage battery 38 powered the starter motor 30 during a cold crank, and when the primary low-voltage battery 38 powered the starter generator 34 during a warm crank. Electrically decoupling the first electrical system 82 from the second electrical system 86 during a warm crank can prevent the warm cranking of the engine 14 from influencing the voltage on a bus of the first electrical system 82.

In contrast to such designs, the BIB 90 in the exemplary embodiment can be commanded to periodically electrically couple the first electrical system 82 to the second electrical system 86 when the primary low-voltage battery 38 powers the starter motor 30 during a cold crank. Periodically means, for example, electrically coupling the first electrical system 82 to the second electrical system 86 through the BIB 90 every ten cold cranks of the engine 14. The described cold crank actively discharges and electrically loads both the primary low-voltage battery 38 and the auxiliary low-voltage battery 78.

In other examples, the primary low-voltage battery 38 and the auxiliary low-voltage battery 78 could be electrically loaded in other ways that do not require a cold crank of the engine 14. The other electrical loads can be loads that are sufficient to place a defined amount of electrical draw on the primary low-voltage battery 38 and the auxiliary low-voltage battery 78. Potentially, the other electrical loads can be electrical loads that, when activated, are not readily noticed by an occupant of the vehicle. The other electrical loads could be, for example, loads associated with powering powertrain radiator cooling fans, powering a windshield heater, powering a side view mirror heater.

When the first electrical system 82 is electrically coupled to the second electrical system 86 during a cold crank, a sensor assembly 94 detects an electrical parameter of the auxiliary low-voltage battery 78. The sensor assembly 94 could be a Hall effect sensor, and the electrical parameter could be a discharge current from the auxiliary low-voltage battery 78, for example.

The detected electrical parameter of the auxiliary low-voltage battery 78 is then compared to one or more threshold values to assess a condition of the auxiliary low-voltage battery 78. For example, the electrical parameter could be a discharge current from the auxiliary low-voltage battery 78. In such an example, the discharge current detected by the sensor assembly 94 can be compared to a threshold discharge current. If the detected threshold current is less than the threshold discharge current, the condition of the auxiliary low-voltage battery 78 could be considered to have degraded such that replacing the auxiliary low-voltage battery 78 is recommended.

The exemplary vehicle 10 includes a controller 98 that can command the BIB 90 to transition such that the first electrical system 82 is electrically coupled to the second electrical system 86, or such that the first electrical system 82 is electrically decoupled from the second electrical system 86. The controller 98 can further receive a signal from the sensor assembly 94 indicating or representing the electrical parameter detected by the sensor assembly 94. The controller 98 can compare that electrical parameter of the auxiliary low-voltage battery 78 to a threshold value to assess a condition of the auxiliary low-voltage battery 78.

While schematically illustrated as a single controller 98, the controller 98 may be part of a larger control system that may be controlled by various other controllers throughout the vehicle 10, such as a vehicle system controller (VSC) that includes a powertrain control unit, a transmission control unit, and engine control unit, etc. It should therefore be understood that the controller 98 and one or more other controllers can collectively be referred to as a controller that controls, such as through a plurality of interrelated algorithms, that transitioning of the BIB 90 and the receipt of the electrical parameter from the sensor assembly 94 as well as the comparison of the signal from the sensor assembly 94 to a threshold value.

The controller 98 can include a microprocessor or central processing unit (CPU) in communication with various types of computer readable storage devices or media. Computer readable storage devices or media may include volatile and nonvolatile storage and read-only memory (ROM), random-access memory (RAM), and keep-alive memory (KAM), for example. KAM is a persistent or non-volatile memory that may be used to store various operating variables while a CPU of the controller 98 is powered down.

Computer-readable storage devices or media may be implemented using any number of known memory devices, such as PROMS (programmable read-only memory), EPROMS (electrically PROM), EEPROMS (electrically erasable PROM), flash memory, or another electric, magnetic, optical, or combination memory devices capable of storing data some of which represent executable instructions used by the controller 98 and controlling the BIB 90, receiving an input from the sensor assembly 94, and comparing the input to a threshold value.

The controller 98 may communicate with the sensor assembly 94 as well as other various engine/vehicle sensors and actuators via an input/output interface implemented as a single integrated interface that provides various raw data or signal conditioning, processing, and/or conversion, short-circuit protection, and the like. One or more dedicated hardware or firmware chips could be used to condition and process particular signals before being supplied to a CPU of the controller 98. As schematically illustrated in FIG. 2, the controller 98 can receive and communicate signals to and from the BIB 90 and the sensor assembly 94.

Although not explicitly illustrated, those of ordinary skill in the art could recognize various functions or components that may be controlled by the controller 98 within various subsystems of the vehicle.

Control logic of the controller 98 can be implemented in software, hardware, or a combination of software and hardware in one or more specific controllers of the controller 98 depending upon the particular application. When implemented in software, the control logic may be provided in one or more computer-readable storage devices or media having stored data representing code or instructions executed by a computer to control the vehicle 10 or its subsystems. The computer-readable storage devices or media may include one or more of a number of known physical objects which utilize electric, magnetic, and/or optical storage to keep executable instructions and associated operating variables, threshold variables, and the like.

An accelerator pedal (not shown) of the vehicle 10 may be used by a driver of the vehicle 10 to provide demanded torque, power, or drive commands to propel the vehicle 10. In general, depressing and releasing the accelerator pedal generates an accelerator pedal position signal that may be interpreted by the controller 98 as a demand for increased power or decreased power, respectively. Based at least upon input from the accelerator pedal, the controller 98 can command the starter generator 34 to warm crank the engine 14 during a drive cycle. The driver, for example, could depress the accelerator pedal to increase a power demand necessitating the warm crank of the engine 14 during the drive cycle. Thus, although the controller 98 is shown as operably linked to the sensor assembly 94 and the BIB 90, the controller 98 could receive various inputs and issue various commands to areas of the vehicle 10.

Figure 3:
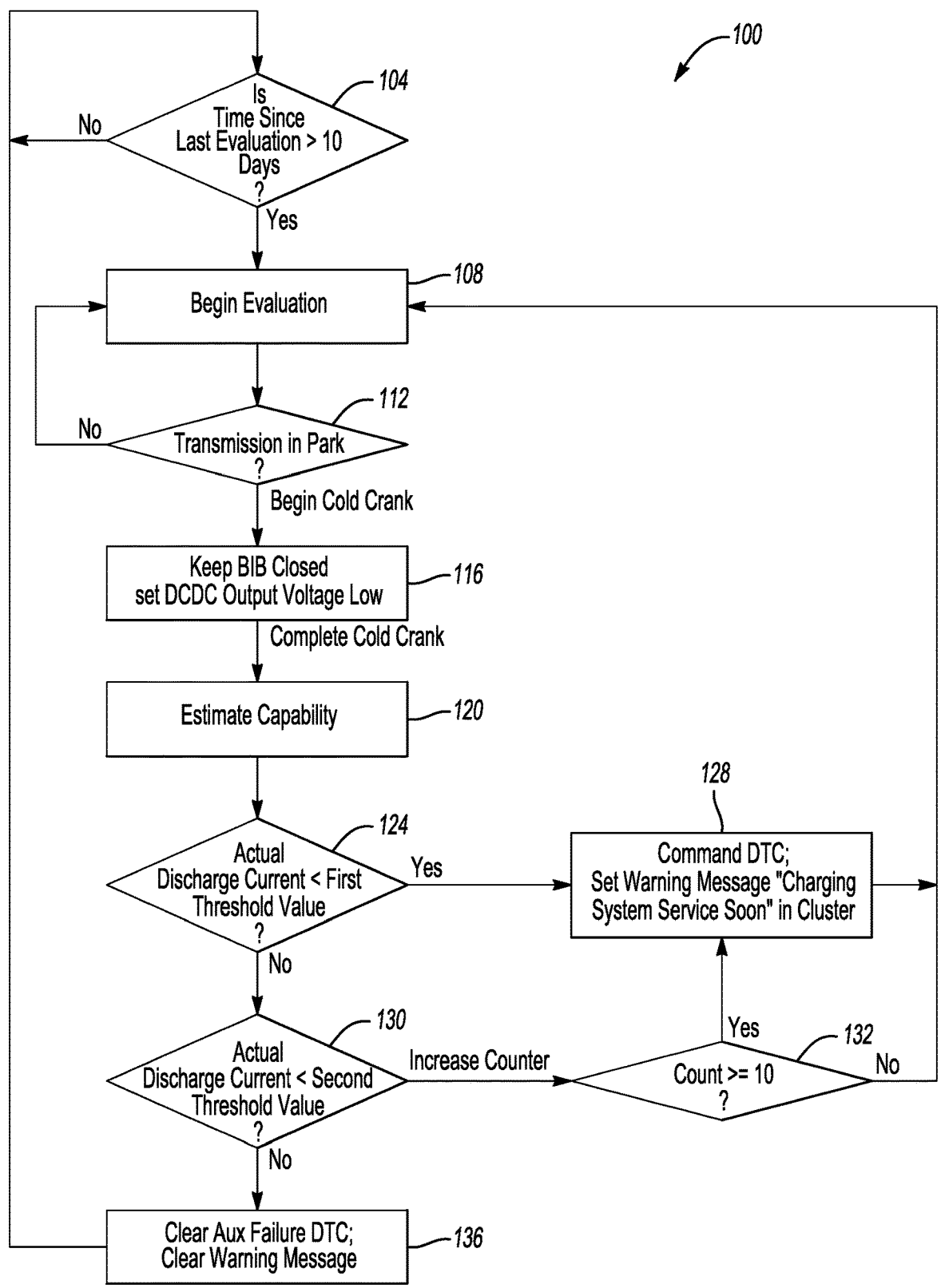
FIG. 3 illustrates a flow of a method of monitoring a battery of the electrified vehicle of FIG. 1.

With reference now to FIG. 3, an exemplary method 100 executed by the controller 98 can begin at a step 104 which assesses whether a time since a last evaluation of the auxiliary low-voltage battery 78 is greater than a threshold time. The threshold time is ten days in this example. If the last evaluation of the auxiliary low-voltage battery 78 occurred less than ten days ago, the method 100 returns to the step 104. Here, the assessment in the step 104 is made prior to cold crank of the engine 14.

If the last evaluation of the auxiliary low-voltage battery 78 was more than ten days ago, the method 100 moves to a step 108 where an evaluation of the auxiliary low-voltage battery 78 begins.

Next, at a step 112, the method 100 assesses whether a transmission of the vehicle 10 is in a parking gear. If not, the method 100 returns to the step 108.

If, at the step 112, the transmission is in a parking gear, the method 100 cold cranks the engine 14 and moves to the step 116, which transitions the BIB 90 to a state where the first electrical system 82 is electrically coupled to the second electrical system 86, or maintains the BIB 90 in a state where the first electrical system 82 is electrically coupled to the second electrical system 86. The cold crank can further be in response to a key-on condition input by a user. The BIB 90 maintains the first electrical system 82 in a position electrically coupled with the second electrical system 8 until the cold crank of the engine 14 is complete. At the step 116, in the exemplary embodiment, the method 100 also lowers an output voltage from the DC/DC converter 74.

In some examples, the BIB 90 may be electrically coupling the first electrical system 82 to the second electrical system 86 when a current through the BIB 90 is less than a threshold BIB current value. That is, to protect the BIB 90, the electrical coupling through the BIB 90 during the cold start may be avoided if the current that will pass through the BIB 90 is greater than a threshold BIB current value.

Next, the method 100 moves to the step 120 which starts the estimating of a capability of the auxiliary low-voltage battery 78. The estimation is based on a comparison of the electrical parameter detected by the sensor assembly 94 (during the cold crank) with a threshold value.

The controller 98 can receive an input from the sensor assembly 94 indicating a minimum voltage of the auxiliary low-voltage battery 78 measured during the cold crank, and another input indicating the highest discharge current measured by the sensor assembly 94 during the cold crank.

The discharge current can vary as a function of a voltage drop of the auxiliary low-voltage battery 78 during the cold crank. The threshold value that is compared to the discharge current measured by the sensor assembly 94 can vary based on, among other things, the minimum voltage of the auxiliary low-voltage battery 78 detected during the cold crank and temperature.

Table 1 below indicates exemplary relationships between a discharging current as a function of battery voltage and temperature.

TABLE I

|  | −10° C. | 0° C. | 25° C. | 40° C. |
| --- | --- | --- | --- | --- |
| 12.0 Volts | 23 amps | 25 amps | 32 amps | 36 amps |
| 11.5 Volts | 34 amps | 37 amps | 48 amps | 54 amps |
| 11.0 Volts | 46 amps | 50 amps | 63 amps | 72 amps |
| 10.5 Volts | 57 amps | 62 amps | 79 amps | 89 amps |

With reference to Table I, if, for example, the controller 98 assesses that the voltage of the auxiliary low-voltage battery 78 dropped to 11 Volts during the cold crank, and that a temperature of the auxiliary low-voltage battery 78 is 0° Celsius, the controller 98 could utilize 50% of 50 amps (i.e., 25 amps) as a first threshold value. The controller 98 would then compare the discharge current measured by the sensor assembly 94 to 25 amps. If the actual discharge current is less than 25 amps, the controller 98 would recognize that the condition of the auxiliary low-voltage battery 78 may be degraded.

The method 100 makes this comparison at the step 124. If the actual discharge current measured by the sensor assembly 94 is less than the first threshold value, the method 100 moves to the step 128. Here, the controller 98 can command the issuing of a diagnostic trouble code indicating the condition of the auxiliary low-voltage battery 78. The method 100 can, at the step 128, further set an alert message within, for example, an instrument cluster of the vehicle 10. The alert message may indicate that the user should service the auxiliary low-voltage battery 78 soon. After the step 128, the method 100 returns to the step 108.

If, at the step 124, the actual discharge current measured by the sensor assembly 94 is not less than the first threshold value, the method 100 can move to a step 130 which compares the actual discharge current measured by the sensor assembly 94 to a second threshold value. The second threshold value may be higher than the first threshold value from a step 124. The second threshold value used, like the first threshold value, can vary based on a voltage drop, temperature, or based on some other factors. In this example, the second threshold value can be 70% of 50 amps (i.e., 35 amps).

If the actual discharge current measured by the sensor assembly 94 is less than the second threshold value, the method 100 increases a counter by one and moves from the step 120 to the step 132. At the step 132, the method 100 assesses whether the counter has met or exceeded a number of counts, here, ten. If the counter has exceeded the number of counts, the method 100 then progresses back to the step 128, which sets the diagnostic trouble code and instead, or additionally, displays a message to the user.

The steps 130 and 132 can detect a condition of an auxiliary low-voltage battery 78 that differs from the condition detected in the step 124. The repeated number of slight deviations of the actual discharge current from the second threshold value can, over time, indicate degradation of the auxiliary low-voltage battery 78. The counter is used so that user is only notified if the variation from the second threshold value continues over multiple cold starts.

If, at the step 132, the counter has not met or exceeded the number of counts, the controller 98 can, in some examples, command a refresh charge of the auxiliary low-voltage battery 78. During a refresh charge, the auxiliary low-voltage battery 78 can be charged with voltage that is higher, say 0.5 Volts higher, than a conventional recharge. The higher voltage of the reference charge may, the next time the method 100 is executed, cause the discharge current from the auxiliary low-voltage battery 78 to increase above the second threshold value.

If, at the step 130, the actual threshold current detected by the sensor assembly 94 is not less than the second threshold value, the method moves to the step 136 which resets the counter, clears any diagnostic trouble code, and any alert message. The method 100 moves from the step 136 back to the step 104.

The method 100 relies on a cold crank to electrically load the primary low-voltage battery and the auxiliary low-voltage battery. The method 100 could electrically load in other ways in other examples. For example, the method 100 could electrically load the primary low-voltage battery and the auxiliary low-voltage battery with loads that are not easily noticed by the driver or passengers within the vehicle—a window heater, for example.

It should be understood that the highly schematic depictions shown in the Figures are merely exemplary and is not intended to be limiting on this disclosure. Other configurations are additionally or alternatively contemplated.

Although a specific component relationship is illustrated in the figures of this disclosure, the illustrations are not intended to limit this disclosure. In other words, the placement and orientation of the various components shown could vary within the scope of this disclosure. In addition, the various figures accompanying this disclosure are not necessarily to scale, and some features may be exaggerated or minimized to show certain details of a particular component.

The preceding description is exemplary rather than limiting in nature. Variations and modifications to the disclosed examples may become apparent to those skilled in the art that do not necessarily depart from the essence of this disclosure. Thus, the scope of legal protection given to this disclosure can only be determined by studying the following claims.

What is claimed is:

1. A monitoring method, comprising:
   within a vehicle, providing a first electrical system with an auxiliary battery, and a second electrical system with a primary battery;
   electrically coupling the first electrical system to the second electrical system;
   electrically loading the auxiliary battery and the primary battery; and
   comparing an electrical parameter of the auxiliary battery to a threshold value to assess a condition of the auxiliary battery,
   wherein the vehicle is a stop-start vehicle, wherein electrically loading the auxiliary battery and the primary battery includes cranking an engine of the vehicle at a start of a vehicle drive cycle, and further comprising, later in the vehicle drive cycle, stopping the engine and then warm cranking the engine using a starter generator powered by the primary battery.

2. The monitoring method of claim 1, wherein the starter generator is a belt integrated starter generator.

3. The monitoring method of claim 1, electrically decoupling the first electrical system from the second electrical system when warm cranking the engine using the starter generator.

4. The monitoring method of claim 3, further comprising powering electrical loads of the vehicle using the auxiliary battery when the first electrical system is decoupled from the second electrical system.

5. The monitoring method of claim 3, further comprising transitioning at least one switch to electrically couple the first electrical system to the second electrical system, and transitioning the at least one switch to electrically decouple the first electrical system from the second electrical system.

6. The monitoring method of claim 5, wherein the at least one switch is within a battery isolation box.

7. The monitoring method of claim 1, further comprising cold cranking the engine at the start of the vehicle drive cycle using a starter motor powered by the auxiliary battery.

8. The monitoring method of claim 1, wherein the auxiliary battery and the primary battery are each 12-Volt low-voltage batteries.

9. The monitoring method of claim 1, wherein the first electrical system includes a high-voltage battery.

10. The monitoring method of claim 1, wherein the electrical parameter is a discharge current from the auxiliary battery.

11. The monitoring method of claim 10, further comprising detecting the discharge current from the auxiliary battery using a Hall effect sensor.

12. A monitoring method, comprising:
    within a vehicle, providing a first electrical system with an auxiliary battery, and a second electrical system with a primary battery, the auxiliary battery and the primary battery each low-voltage batteries;
    electrically coupling the first electrical system to the second electrical system;
    electrically loading the auxiliary battery and the primary battery;
    comparing an electrical parameter of the auxiliary battery to a threshold value to assess a condition of the auxiliary battery; and
    disabling a start-stop function of the vehicle in response to the condition of the auxiliary battery.

13. The monitoring method of claim 12, further comprising communicating a message to a user of the vehicle in response to the condition of the auxiliary battery.

14. The monitoring method of claim 12, further comprising disabling a DC/DC converter within the first electrical system during the comparing.

15. The monitoring method of claim 12, wherein the auxiliary battery and the primary battery are each 12-Volt, lead acid, low-voltage batteries.

* * * * *